(12) United States Patent
Abe

(10) Patent No.: US 6,252,897 B1
(45) Date of Patent: Jun. 26, 2001

(54) EXTERNAL MIRROR TYPE WAVELENGTH TUNABLE LASER

(75) Inventor: Yuji Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/213,177

(22) Filed: Dec. 17, 1998

(30) Foreign Application Priority Data

Dec. 18, 1997 (JP) .................................... 9-349653

(51) Int. Cl.[7] .............................. H01S 3/121; H01S 3/11; H01S 3/10; H01S 3/08

(52) U.S. Cl. .............................. 372/101; 372/14; 372/16; 372/20

(58) Field of Search .................................... 372/101, 102, 372/14, 16, 20

(56) References Cited

U.S. PATENT DOCUMENTS

| 5,548,609 | * | 8/1996 | Kitamura ................................ 372/92 |
| 6,031,852 | * | 2/2000 | Thompson et al. ..................... 372/20 |

FOREIGN PATENT DOCUMENTS

| 0 480 562 | 4/1992 | (EP) . |
| 09092933 | * | 9/1995 | (JP) . |
| 8-97516 | 4/1996 | (JP) . |
| 9-92933 | 4/1997 | (JP) . |
| 9-260792 | 10/1997 | (JP) . |

OTHER PUBLICATIONS

Japanese Office Action dated Jun. 1, 1999, with partial translation.
European Search Report dated Mar. 25, 1999.
Patent Abstracts of Japan; Vublication No. JP 01 286488 A (Matsushita Electric Ind. Co. Ltd.); vol. 14, No. 67 (E–0885); dated Feb. 7, 1990.
Patent Abstracts of Japan; Publication No. JP 57 085281 A (Tomijima Takumi); vol. 6, No. 170 (E–128); dated Sep. 3, 1982.

* cited by examiner

Primary Examiner—Frank G. Font
Assistant Examiner—Armando Rodriguez
(74) Attorney, Agent, or Firm—McGinn & Gibb, PLLC

(57) ABSTRACT

In an external mirror type semiconductor laser composed of a semiconductor laser having a structure wherein a reflection factor is reduced on one end plane thereof, and a lens as well as a grating type reflector disposed on the side of the end plane, respectively, the lens is shifted in the direction orthogonal to a light axis, and an incident angle of the light outputted from the end plane to the grating type reflector is changed, whereby an external mirror type wavelength tunable laser having a simple structure and tuning a radiated wavelength can be realized.

12 Claims, 2 Drawing Sheets

EXTERNAL MIRROR TYPE WAVELENGTH TUNABLE LASER

FIELD OF THE INVENTION

The present invention relates to an external mirror type wavelength tunable laser, and particularly to an external mirror type wavelength tunable laser which can tune the wavelength so as to be used suitably for optical communication.

BACKGROUND OF THE INVENTION

In recent years, improvements in performance of computer are remarkable so that computer-computer communications are implemented usually in ordinary home. Furthermore, internet is developed in world-wide scale so that circumstances in communication are changed violently.

Under these circumstances, information is required instantly by one who is concerned with communications. Upon demand at such request, optical-fiber telecommunication system by which a large amount of various information can be transmitted at high-speed is utilized as the media.

Recently, it is required to transmit at real time not only character information, but also a variety of information such as still image, dynamic image and speech data, so that high-capacity optical-fiber telecommunication system becomes developed.

Moreover, in order to transmit data through an optical-fiber telecommunication system over great distances, it is required to amplify lightwave signals in the course of optical-fiber line. In this respect, introduction of erbium doped optical-fiber amplification (EDFA) is made also as means for light amplification.

When EDFA system is applied as means for light amplification, wavelength division multiplex is performed within a wavelength band of EDFA (about 30 nm in the existing state) to make mass-storage of data, so that the above described transmission system is proceeding toward practical utilization.

In this system, a number of light sources each having a specified wavelength are required. In the case where a plurality of light sources are used, there are disadvantages of high cost, upsizing of equipment, high consumption of energy and the like, and hence, it is desired to eliminate these disadvantages.

Accordingly, it is desired to realize a wavelength tunable laser in which a wavelength can be tuned arbitrarily within the wavelength band of EDFA, i.e., that of about 30 nm, so that the wavelength can be specified to a predetermined wavelength.

Wavelength tunable lasers are classified broadly into semiconductor monolithic types and external mirror types. As to the semiconductor monolithic type wavelength tunable laser, no practical unit exists which can tune wavelength within a range of wavelength as wide as about 30 nm corresponding to that of EDFA.

On the other hand, the disadvantage of the external mirror type is that a mechanism for rotating a grating type reflector becomes upsizing. Where such grating type reflector is used as the external mirror so that tuning is done by changing the incident angle of light, wherein a manner for rotating the grating reflector by the use of a motor and the like manner is required.

SUMMARY OF THE INVENTION

Accordingly, it is an object of the present invention to provide an external mirror type wavelength tunable laser having a simple structure and capable of tuning an emitting wavelength.

According to the invention, an external mirror type wavelength tunable laser, comprises a semiconductor laser having one end plane of a reduced reflection factor; a lens provided to face the one end plane of the semiconductor laser; a grating type reflector for reflecting a light supplied via the lens from the one end plane of the semiconductor; and means for shifting the lens in a direction orthogonal to a light axis of the lens to change an incident angle of the light to the grating type reflector.

It is preferred that the above described shifting means is a piezoelectric element.

Furthermore, it is preferred that focal point of the lens is set on the above described end plane of the semiconductor laser.

Moreover, it is preferred that the light outputted from the above described end plane is converted into parallel light.

Further, it is preferred that the above described lens is an aspherical lens.

BRIEF DESCRIPTION OF THE DRAWINGS

The present invention will be explained in more detail in conjunction with appended drawings, wherein.

DESCRIPTION OF THE PREFERRED EMBODIMENTS

Figure 1:
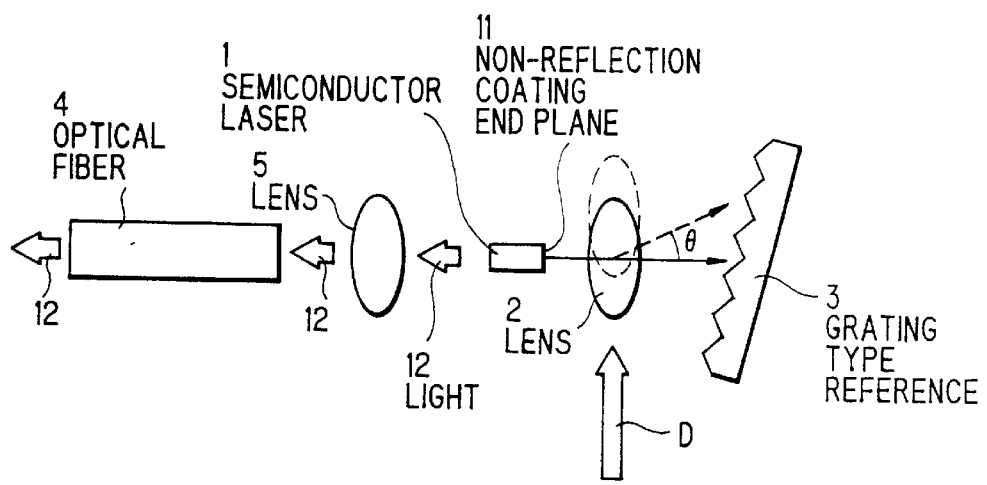
FIG. 1 is an explanatory diagram showing a constitution of the external mirror type wavelength tunable laser according to an embodiment of the present invention.

FIG. 1 is an explanatory diagram showing a constitution of the external mirror type wavelength tunable laser according to the embodiment of the invention wherein non-reflection coating is applied to one end plane 11 of a semiconductor laser 1, whereby each reflection factor of input light and output light is reduced in the end plane 11. The light outputted from the semiconductor laser 1 is converted into parallel light by means of a lens 2 either focal point of which is placed so as to face the end plane 11 of the semiconductor laser 1.

The lens 2 is movable in a plane orthogonal to a direction of laser beam (light axis) outputted from the end plane 11 of the semiconductor laser 1. When a position of the lens 2 is changed, the direction of laser beam outputted from the end plane 11 can be varied. For example, when the lens 2 has been shifted up to a position represented by the broken line in FIG. 1 as a result of transferring the lens 2 along the direction represented by arrow D in the figure, an outputting direction of light changes with an angle θ shown in FIG. 1.

A grating type reflector 3 separates spatially the laser beam which was outputted from the end plane 11 of the semiconductor laser 1 and has been converted into parallel light by means of the lens 2 in each wavelength.

Moreover, another lens 5 is disposed on the side of the opposite end plane of the semiconductor laser 1. The lens 5 functions to collect the laser beam outputted from the above described end plane of the semiconductor laser 1. The laser beam outputted from the semiconductor laser 1 is propagated through an optical fiber 4.

No non-reflection coating has not been applied to the opposite end plane of the semiconductor laser 1, so that a resonator is composed of the present end plane and the grating type reflector 3.

As mentioned above, the grating type reflector 3 functions to separate spatially the laser beam which was λ outputted from the end plane 11 of the semiconductor laser 1 and has been converted into parallel light by means of the lens 2 in each wavelength. Thus, the wavelengths satisfying the resonating condition required by the resonator are restricted, so that laser beam of prescribed wavelengths can be obtained.

Furthermore, since an angle at which parallel light is inputted to the grating type reflector 3 can be varied by changing a position of the lens 2 as mentioned above, a wavelength of the laser beam outputted becomes variable.

The above-mentioned grating type reflector exhibits remarkable wavelength dependency, so that it has a significant reflection factor at a specified wavelength. In this respect, a wavelength at which the reflection factor becomes the peak varies by changing an incident angle θ of the light to be inputted to the grating type reflector 3. When a wavelength at which the reflection factor becomes the peak is represented by λ, a relationship between the peak wavelength λ and the angle θ of incident light is given by the following equation (1):

$$d\lambda/d\theta = \cos\theta/Nm \quad (1)$$

where N is the number of grooves per 1 mm of grating, and m is a degree of diffraction.

The present embodiment is characterized by changing an angle θ of the incident light applied to the grating type reflector 3 by shifting a position of the lens 2 in the direction orthogonal to the light axis.

In the present embodiment, the lens 2 is disposed at a position away from the end plane 11 of the semiconductor laser 1 exhibiting a reduced reflection factor by a focal length f of the lens 2, and in addition, the laser beam outputted from the end plane 11 is converted into parallel light by means of the lens 2 as mentioned above.

In this arrangement, a relationship between a lens moving distance dx with respect to the light axis of the lens 2 and an angle θ of incident light to the grating type reflector 3 is given by the following equation (2):

$$d\theta/dx = 1/f \quad (2)$$

From the above described equations (1) and (2), the following equation (3) is obtained:

$$d\lambda/dx = \cos\theta/(Nmf) \quad (3)$$

According to equation (3), the peak wavelength of the grating type reflector 3 may be changed by shifting a position of the lens 2 in the direction orthogonal to the light axis.

In the following, the invention will be described by employing specific parameters.

The grating type reflector 3 is used in Littrow mounting wherein primary diffraction is applied in a wavelength band of 1550 nm. The parameters in this situation are as follows.

$\cos\theta = 0.893$ $N = 500 \,[1/mm]$ $m = 1$

Further, an aspherical lens having a focal distance $f = 600$ mm is used as the lens 2.

When these numerical values are assigned to the equation (3), it yields:

$$d\lambda/dx = 3 \times 10^{-3}$$

An example of characteristics of the external mirror type wavelength tunable laser according to the embodiment of the present invention will be described hereinafter.

A semiconductor laser used in the embodiment was the one having a gain peak wavelength of around 1560 nm. A reflection factor of the end plane 11 to which non-reflection coating has been applied to reduce the reflection factor is about 0.5%. Measurement of the characteristics has been made by utilizing the light outputted from the optical fiber in FIG. 1.

Figure 2:
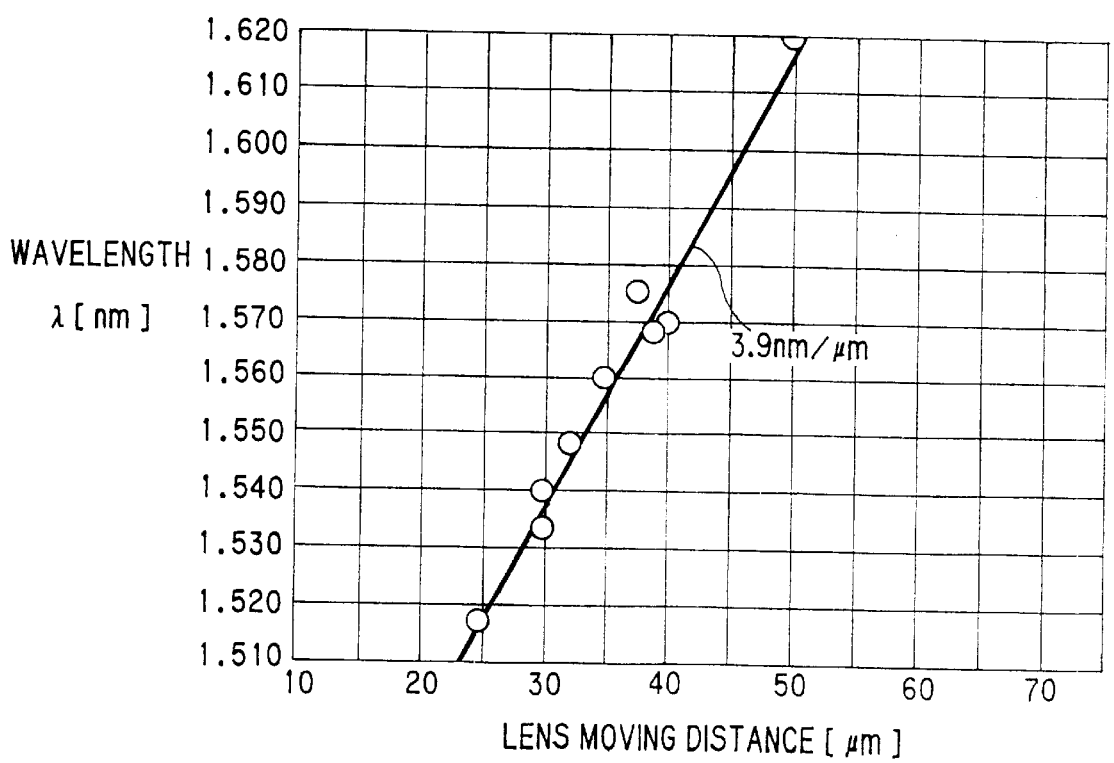
FIG. 2 is a graph indicating an example of characteristics of a relationship between emitted wavelength and moving distance of a lens in the external mirror type wavelength tunable laser according to an embodiment of the present invention.

FIG. 2 is a graph indicating an example of characteristics of a relationship between emitted wavelength and moving distance of the lens 2 in the external mirror type wavelength tunable laser according to the embodiment of the present invention wherein mark "o" indicates measured values.

As is apparent from FIG. 2, radiation of laser was confirmed within an extremely wide range of about 100 nm extending from 1510 nm to 1620 nm.

A rate of change $d\lambda1/dx$ in emitted wavelength with respect to a moving distance of the lens 2 is about 3.9 [nm/mm] = $3.9 \times 10^{-3}$. The result is somewhat larger than the above-mentioned calculated value, but emitted wavelength varies in proportion to moving distance of the lens, whereby appropriateness of the external mirror type wavelength tunable laser according to the present embodiment was confirmed.

Figure 3:
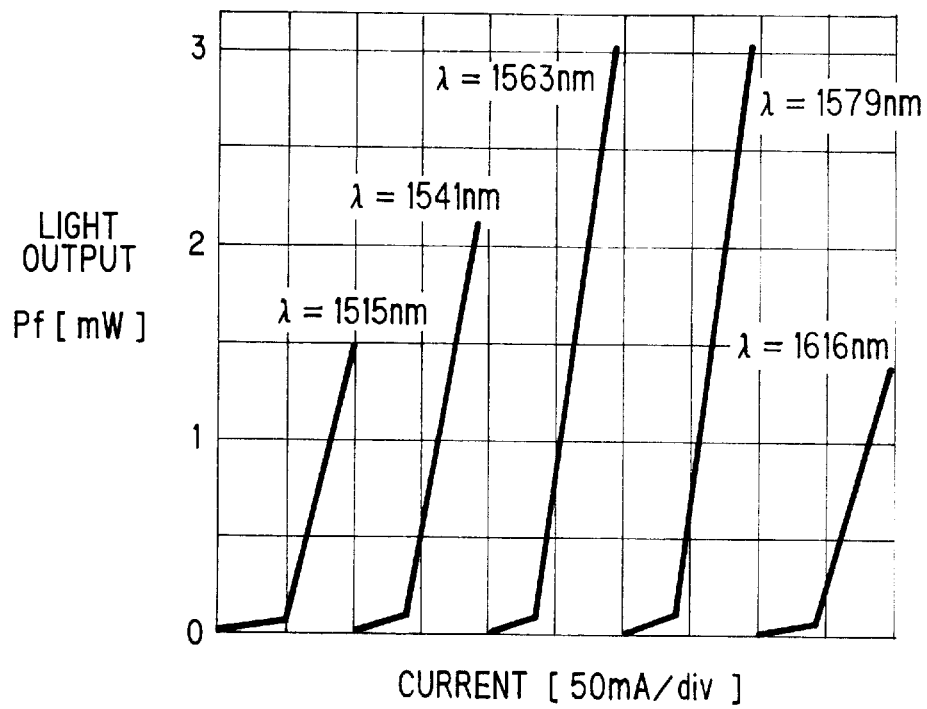
FIG. 3 is a graph indicating an example of characteristics of light output versus current in the external mirror type wavelength tunable laser according to the embodiment of the present invention.

FIG. 3 is a graph indicating an example of characteristics of light output versus electric current in the external mirror type wavelength tunable laser according to the embodiment of the present invention.

In FIG. 3, since the gain peak wavelength of the semiconductor laser 1 was in the vicinity of 1560 nm, a threshold current value in the vicinity of that wavelength is the lowest and the light output is also significant, while it is remarkable that threshold current value increases and light output decreases at a wavelength away from that wavelength of, for example, 1515 nm and 1616 nm.

As described above, about 100 nm is attained as a wavelength tunable range of the external mirror type wavelength tunable laser according to the present embodiment. However, it is considered to be reasonable to use the external mirror type wavelength tunable mirror within a range of wavelength of around 50 nm in view of practical point of view with taking light output and threshold current value characteristics into consideration.

The external mirror type wavelength tunable laser according to another embodiment of the present invention will be described hereinafter.

Figure 4:
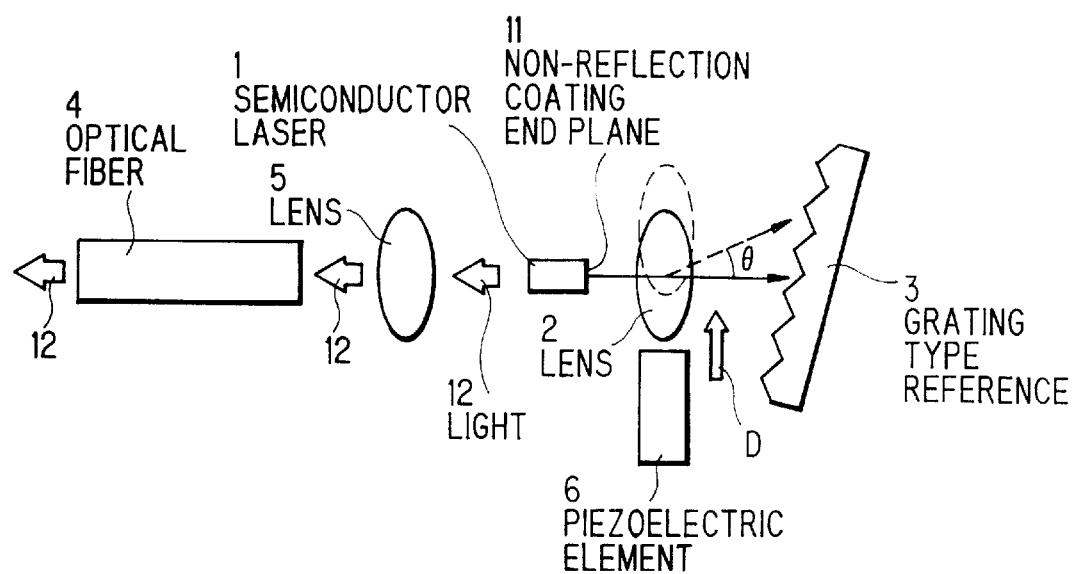
FIG. 4 is an explanatory diagram showing a constitution of the external mirror type wavelength tunable laser according to another embodiment of the present invention.

FIG. 4 is an explanatory diagram showing a constitution of the external mirror type wavelength tunable laser according to another embodiment of the invention wherein the same or like parts in the present embodiment are designated by the same reference numbers as those of the former embodiment shown in FIG. 1, and the explanation therefor is omitted.

The external mirror type wavelength tunable laser according to the present embodiment of the invention shown in FIG. 4 differs from that of the former embodiment shown in FIG. 1 in that a piezoelectric element 6 is utilized as the means for shifting a position of the lens 2.

An element from which a shifting amount of around 10 mm is obtained by changing an applied voltage from 0 volt to 100 volts was employed as the piezoelectric element 6. As an actual tunable range of wavelength, about 40 nm ranging from 1540 nm to 1580 nm was confirmed.

In order to achieve a wider tunable range of wavelength by a smaller moving distance, reduction of the number N of grooves in the grating type reflector 3 based on the above-mentioned equation (3) as well as reduction of a focal distance f of the leans 2 are effective.

However, it is not so practical to reduce the number N, because it results in decrease in wavelength resolving power as well as in diffraction efficiency of the grating type reflector.

On the other hand, reduction of focal distance f can be realized by employing a microlens having a shorter focal distance f. For instance, when a plate microlens is used, a wavelength tunable range of around 40 nm can be realized by a lens moving distance of 2 to 3 mm , since such plate microlens has a short focal distance of around a little less than 100 mm.

While the present invention has been explained in conjunction with the above described embodiments, it is not limited only thereto.

For instance, although an aspherical lens has been employed as the lens 2 in the embodiment described in relation to FIG. 1, the same advantageous effects can be obtained by employing even another type of lens. Furthermore, while the lens 2 has been disposed at a position away from the end plane 11 of the semiconductor laser 1 having a reduced reflection factor by a distance corresponding to the focal distance of the lens 2 in the same embodiment, the position is not limited thereto.

Moreover, while the case where the piezoelectric element 6 is used as means for shifting electrically a position of the leans 2 has been described in the latter embodiment shown in FIG. 4, the invention is not limited thereto.

As described above, according to the present invention, an external mirror type semiconductor laser composed of a semiconductor laser having a structure wherein a reflection factor is reduced on one end plane thereof, a lens, and a grating type reflector, both the members being disposed on the side of the end plane, comprises further means for shifting the aforesaid lens in a direction orthogonal to a light axis to change an incident angle of the light outputted from the aforesaid end plane to the grating type reflector. As a result, the invention exhibits such advantage of being capable of realizing a wavelength tunable laser over a wide range of wavelength of several tens nm or more.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An external mirror type semiconductor laser, comprising:

a semiconductor laser having one end plane of a reduced reflection factor;

a lens provided to face said one end plane of said semiconductor laser;

a grating type reflector for reflecting a light supplied via said lens from said one end plane of said semiconductor; and means for shifting said lens in a direction orthogonal to a light axis of said lens to change an incident angle of said light to said grating type reflector.

2. The external mirror type semiconductor laser as defined in claim 1, wherein said means for shifting the lens comprises a piezoelectric element.

3. The external mirror type semiconductor laser as defined in claim 1, wherein a position of either of the focal points of said lens is set onto said end plane.

4. The external mirror type semiconductor laser as defined in claim 1, wherein said lens converts the light outputted from said end plane into parallel light.

5. The external mirror type semiconductor laser as defined in claim 1, wherein said lens comprises an aspherical lens.

6. An external mirror type semiconductor laser, comprising:

a semiconductor laser having one end plane of a reduced reflection factor;

a focusing lens provided to face said one end plane of said semiconductor laser;

a grating type reflector for reflecting a light supplied via said lens from said one end plane of said semiconductor; and means for shifting said lens in a direction orthogonal to a light axis of said lens to change an incident angle of said light to said grating type reflector.

7. The external mirror type semiconductor laser as defined in claim 6, wherein said means for shifting the lens comprises a piezoelectric element.

8. The external mirror type semiconductor laser as defined in claim 6, wherein a position of either of the focal points of said lens is set onto said end plane.

9. The external mirror type semiconductor laser as defined in claim 6, wherein said lens converts the light outputted from said end plane into parallel light.

10. The external mirror type semiconductor laser as defined in claim 6, wherein said lens comprises an aspherical lens.

11. A method of controlling the wavelength of an external mirror type semiconductor laser comprising a semiconductor laser having one end plane of a reduced reflection factor, a focusing lens provided to face said one end plane of said semiconductor laser, and, a grating type reflector for reflecting a light supplied via said lens from said one end plane of said semiconductor, said method comprising:

shifting a position of said lens in a direction orthogonal to the light axis of said lens to change the incident angle of light to said grating type reflector.

12. The method of claim 11 wherein said shifting of the position of the lens further comprises using a piezoelectric element.

* * * * *